United States Patent [19]

Kadota et al.

[11] 4,224,725
[45] Sep. 30, 1980

[54] METHOD FOR MANUFACTURING AN ACOUSTIC SURFACE WAVE INTERACTION DEVICE

[75] Inventors: Michio Kadota, Kyoto; Tomoharu Sato, Kobe; Kenji Suzuki, Nagaokakyo, all of Japan

[73] Assignee: Murata Manufacturing Co., Ltd., Japan

[21] Appl. No.: 24,024

[22] Filed: Mar. 26, 1979

[30] Foreign Application Priority Data

Mar. 30, 1978 [JP] Japan ................................. 53-37596

[51] Int. Cl.³ ........................................ H01L 41/22
[52] U.S. Cl. ................................. 29/25.35; 361/233
[58] Field of Search .................. 29/25.35; 427/100; 310/313, 359; 361/233; 333/154, 193

[56] References Cited

U.S. PATENT DOCUMENTS 3,945,099  3/1976  Kansy ............................ 29/25.35
3,975,808  8/1976  Stangl ............................ 29/25.35

Primary Examiner—Carl E. Hall
Attorney, Agent, or Firm—Ostrolenk, Faber, Gerb & Soffen

[57] ABSTRACT

A method for manufacturing an acoustic surface wave interaction device includes the steps of forming an interdigitated electrode array on one flat surface of a piezoelectric plate, covering the interdigital electrode with a thin layer of dielectric material, and applying a predetermined DC voltage across the thickness of the piezoelectric plate for polarization.

6 Claims, 6 Drawing Figures

METHOD FOR MANUFACTURING AN ACOUSTIC SURFACE WAVE INTERACTION DEVICE

BACKGROUND OF THE INVENTION

The present invention relates to a method for manufacturing an acoustic surface wave interaction device.

An acoustic surface wave interaction device generally includes a plate of piezoelectric material and a set of interdigitated electrodes laminated on one flat surface of the piezoelectric plate. The piezoelectric plate is polarized between said one surface and the other surface to align the molecules contained in it parallel to each other. According to the conventional method, the acoustic surface wave interaction device is manufactured by the following steps.

First, the plate of piezoelectric material is laminated with a film of conductive material on its opposite flat surfaces. DC voltage is then applied between the two conductive films to polarize the piezoelectric plate. The film of conductive material on one surface is partly removed to form interdigitated electrodes in any desired arrangement by means of any known method, e.g. photolithography. To prevent deterioration of the electrode on exposure to air, and also for the purpose of improving the effective electro-mechanical coupling factor Keff, the side of the piezoelectric plate on which the interdigitated electrodes are formed is coated with a thin layer of dielectric material.

This thin layer of dielectric material is normally formed by a sputtering or vacuum evaporation method. In this method, the temperature of the device is increased during the process of formation of the thin layer of dielectric material so that the thin layer can rigidly be connected to the piezoelectric plate. However, such increased temperature tends to cause the deterioration of the polarization of the piezoelectric plate to such an extent that not only is the coupling factor Keff reduced, but also the insertion loss increases. (It is to be noted that the term "insertion loss" above and hereinafter is intended to mean an energy loss which takes place in the surface wave interaction device when electrically connected to a circuit.) On the other hand, if the thin layer of dielectric material is formed at a low temperature, there will hardly be any deterioration of the polarization of the piezoelectric plate, but the thin layer of the dielectric material will not be rigidly connected to the piezoelectric plate and, therefore, after a period of time, the thin layer can easily separate from the piezoelectric plate.

Furthermore, during the step of polarization of the piezoelectric plate, the surface of the film of the conductive material may be undesirably stained with oil. Accordingly, in the subsequent step of photoetching for removing a part of the film of the conductive material to form the electrodes, the oil on the film tends to hamper complete removal of that part of the film, having a width of several tens of microns, between the electrodes with the result that the neighbouring fingers of the interdigitated electrodes may not be completely separated from each other.

SUMMARY OF THE INVENTION

Accordingly, it is a primary object of the present invention to provide an improved method of manufacturing an acoustic surface wave interaction device in which the piezoelectric plate is highly polarized and yet the thin layer of dielectric material is firmly attached to the plate.

According to the present invention, a method for manufacturing an acoustic surface interaction device comprises the steps of: (a) preparing a piezoelectric plate, (b) forming an array of interdigitated electrodes having a predetermined pattern on one flat surface of the piezoelectric plate, each electrode having a plurality of fingers which interleave with the fingers of the other electrode and a terminal member which is connected to the fingers, (c) entirely covering the fingers of the electrodes, and partly covering the terminal members, with a thin layer of dielectric material, leaving a portion of the terminal member uncovered, (d) applying a layer of conductive material on the opposite flat surface of the piezoelectric plate, and (e) applying a predetermined DC voltage across the thickness of the piezoelectric plate between the uncovered portion of the terminal member and the layer of conductive material, to polarize the piezoelectric plate in the direction of its thickness.

BRIEF DESCRIPTION OF THE DRAWINGS

These and other objects and features of the present invention will become apparent from the following description taken in conjunction with a preferred embodiment thereof with reference to the accompanying drawings, in which.

DETAILED DESCRIPTION OF THE INVENTION

Figure 1:
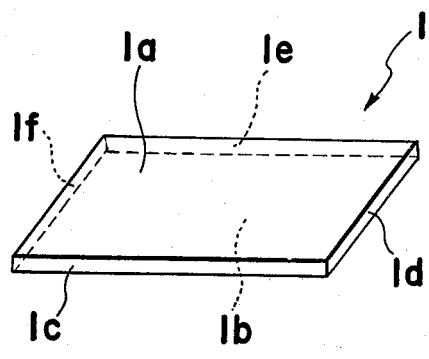
FIG. 1 is a perspective view of a piezoelectric plate which is not polarized.

Referring to FIG. 1, a piezoelectric plate 1 has flat surfaces 1a and 1b opposite to each other and four sides 1c, 1d, 1e and 1f, the sides 1c and 1e being parallel to each other while the sides 1d and 1f are parallel to each other. According to a preferred embodiment of the present invention, the plate 1 is made of a piezoelectric ceramic such as PZT or barium titanate. At least one of the flat surfaces 1a and 1b is well polished to provide a smooth finish and, in addition, in the case where the piezoelectric plate 1 is made of a ceramic, tiny bubbles in the plate 1, particularly in the flat surfaces 1a and 1b, are removed by the use of a hot press technique to further increase the smoothness of the flat surfaces 1a and 1b.

Figure 2:
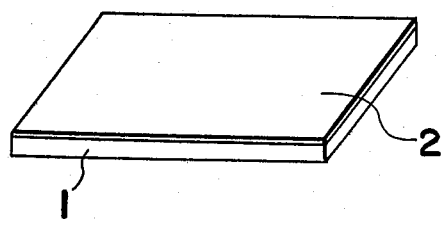
FIG. 2 is a perspective view of the piezoelectric plate provided with a film of conductive material on one flat surface.

Referring to FIG. 2, one flat surface 1a of the piezoelectric plate 1 is firmly laminated with a film 2 of a conductive material, such as aluminum, by means of a known sputtering technique, a vacuum deposition technique or any other known method.

Figure 3:
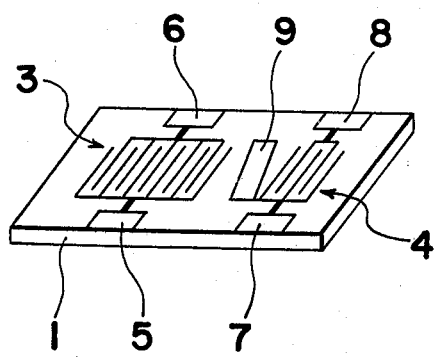
FIG. 3 is a perspective view of the piezoelectric plate showing one pattern of alignment of interdigitated electrodes.

A part of the film 2 is removed to form at least one set of interdigitated electrodes by means of a photolithography technique. FIG. 3 shows two sets of interdigitated electrodes 3 and 4. The first set of interdigital electrodes 3 includes interleaving comb portions formed in the center of the flat surface 1a and a pair of terminal portions 5 and 6 which are provided adjacent the sides 1c and 1e of the plate 1, respectively. Similarly, the second set of interdigitated electrodes 4 includes interleaving comb portions formed adjacent the interleaving comb portions of the first set and a pair of terminal portions 7 and 8, which are provided adjacent the sides 1c and 1e, respectively. The second set of interdigitated electrodes 4, particularly the terminal portion 7, is connected to a shield electrode 9 which is positioned in a space between the comb portions of the electrodes 3 and 4 and is provided for the connection with ground.

It is to be noted that the number of fingers included in each comb, the width and length of each fork and the distance between the two neighboring combs are prearranged to provide a certain pattern of interdigitated electrodes suitable for filtering a predetermined frequency.

It is also to be noted that the terminal plates 5 and 6 which have been described as being provided adjacent the sides 1c and 1e respectively, could be provided adjacent the same side 1c or 1e, or even adjacent sides 1d and/or 1f.

Figure 4:
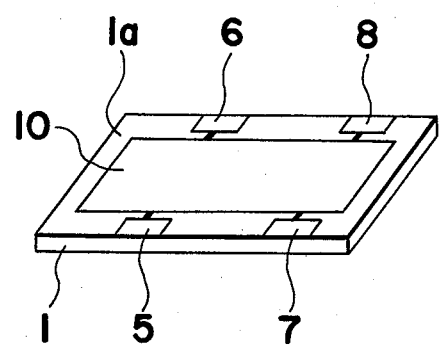
FIG. 4 is a perspective view of the piezoelectric plate showing the interdigitated electrodes covered by a thin layer of dielectric material.

Referring to FIG. 4, a thin layer 10 of dielectric material is securely deposited on the flat surface 1a over the interdigitated electrodes 3 and 4 by means of vacuum deposition, sputtering, ion plating or any other known technique. It is to be noted that according to the present invention, it is necessary to leave at least one portion of each of the terminal portions 5 to 8 uncovered by the thin layer 10, and to cover all the interleaving comb portions. A simple thin layer 10 may cover both the comb portions 3 and 4 and space therebetween, as shown in FIG. 4, or separate dielectric layers may cover electrode sections 3 and 4. This thin layer 10 is preferably formed by such a dielectric material as SiO, $SiO_2$, $Al_2O_3$ or $ZrO_2$.

Figure 5:
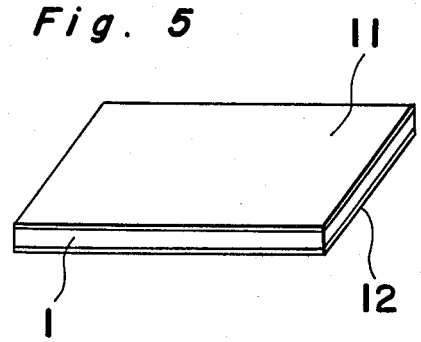
FIG. 5 is a perspective view of the piezoelectric plate showing the piezoelectric plate sandwiched between a pair of conductive layers.

Referring now to FIG. 5, the element which has been prepared as shown in FIG. 4 is sandwiched between two conductive layers 11 and 12 which are preferably made of highly conductive material such as copper. It is also preferable to use one conductive material for one layer 11 and another conductive material for the other layer 12. The bottom layer 12 need not necessarily be formed during the step of FIG. 5, but can be formed during any one of the previous steps described with reference to FIGS. 1 to 4. Since layers 11 and 12 are laminated by means of vacuum deposition, ion plating or any other known technique to ensure tight contact with the element shown in FIG. 4, layer 11 is electrically connected to the terminal portions 5 to 8 and thereby to the interleaving comb portions 3 and 4.

Thereafter, the element shown in FIG. 5 is immersed into oil while a high DC voltage is applied between the layers 11 and 12 to polarize the dielectric plate 1 across its thickness. It is to be noted that the voltage applied to the layers 11 and 12 is higher than the voltage necessary to polarize the dielectric to saturation, and the unit used therefore is volts/mm.

Figure 6:
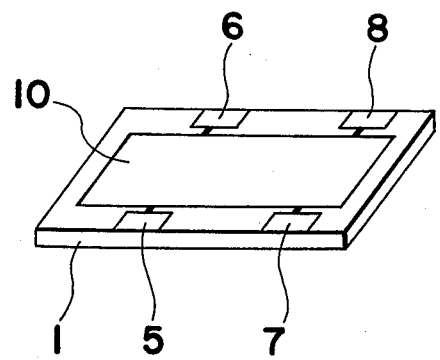
FIG. 6 is a perspective view of an acoustic surface wave interaction device which is manufactured by the method of the present invention.

After the piezoelectric plate 1 has been polarized, layers 11 and 12 are removed by a method of etching or the like to present the acoustic surface wave interaction device as shown in FIG. 6. In the case where layer 12 is formed by a different material from that of layer 11, it is possible to leave layer 12 attached to flat surface 1b for use as an electrode connectable to ground. It is also possible to apply damping material to the element shown in FIG. 6 to eliminate unwanted waves.

According to a preferred embodiment, the terminal portions 5 to 8 may be connected to lead wires (not shown) for external connection and the element shown in FIG. 6 can be accommodated in a casing (not shown).

According to the present invention, since the polarization of the piezoelectric plate 1 is carried out after the provision of the interdigitated electrodes 3 and 8 and the thin layer 10 of dielectric material, the heat necessary to form the interdigitated electrodes 3 and 8 and the dielectric layer 10 will not interfere with the polarization of the piezoelectric plate 1. Thus the coupling factor Keff does not deteriorate and no increase in the insertion loss takes place. Moreover, since the formation of the interdigitated electrodes 3 and 8 and of the layer 10 of dielectric material can be carried out at an elevated temperature, the electrodes 3 and 8 and the dielectric layer 10 can be firmly secured to the piezoelectric plate 1, and therefore there will be no deterioration in the frequency characteristic. Furthermore, the oil used during the polarization will not cause any deformation of the interdigitated electrodes 3 and 8.

It has been found by the present inventors that sufficient polarization of the piezoelectric plate 1 is ensured by the DC voltage applied between the interdigitated electrodes 3 and 4 and terminal portion 9 provided on the upper flat surface 1a and the layer 12 provided on the opposite flat surface. This is because, since the distance between two neighboring fingers of the interleaving electrodes is much smaller than the thickness of the piezoelectric plate 1 while the conductive layer 12 entirely covers the other flat surface 1b, and since the applied voltage is quite high, polarization of the piezoelectric plate 1 is effected not only directly under each of the fingers of the interleaving electrodes, but also in the areas surrounding the fingers.

It has also been found by the present inventors that the saturation voltage for the polarization is determined by the combination of piezoelectric plate 1 and the thin layer 10. Therefore, the application of a high polarization voltage provides an acoustic surface wave interaction device of high quality.

Three different acoustic surface wave interaction devices A, B and C are compared to each other to show the difference in coupling factor Keff and insertion loss therebetween. The device A is formed according to the present invention while the device B is formed according to the conventional method. The device C is formed according to the known method, and that does not include a thin layer 10 of the dielectric material like layer 10 of the present invention. The result of this comparison is shown in Table I.

As apparent from Table I, the application of the thin layer 10 not only protects the interdigitated electrodes, but also improves the coupling factor Keff and reduces insertion loss.

Furthermore, as Table II shows, the method according the present invention is more reliable than the conventional method in producing devices of high quality in terms of coupling factor and insertion loss.

In Table II, a device which falls in the row identified as "Poor quality 1" has some defect not relating to the thin layer 10 whereas a device which falls in the row identified as "Poor quality 2" has some defect relating to the thin layer 10. For example, a device in which the thin layer is not firmly bonded to the piezoelectric plate 1 or in which the thin layer is partly broken would be listed in the row identified as "Poor quality 2". Such a deflect would result in an undesirable trap of the acoustic signal or in an undesirable increase of the ripple.

Table I

|  |  | Device A | Device B | Device C |
|---|---|---|---|---|
| Piezoelectric plate 1 | Material | PZT ceramic | PZT ceramic | PZT ceramic |
|  | Size | 4.8 × 9.5 × 0.4mm | 4.8 × 9.5 × 0.4mm | 4.8 × 9.5 × 0.4mm |
| Input Side Electrodes | Weighting | Apodyzed | Apodyzed | Apodyzed |
|  | Pitch | 68 $\mu$m | 68 $\mu$m | 68 $\mu$m |
|  | Distance Between Fingers | 8.5 $\mu$m | 8.5 $\mu$m | 8.5 $\mu$m |
|  | Number of pairs of Fingers | 60 pairs | 60 pairs | 60 pairs |
| Output Side Electrodes | Weighting | Normal | Normal | Normal |
|  | Pitch | 68 $\mu$m | 68 $\mu$m | 68 $\mu$m |
|  | Distance Between Fingers | 17 $\mu$m | 17 $\mu$m | 17 $\mu$m |
|  | Number of pairs of Fingers | 8 pairs | 8 pairs | 8 pairs |
| Polarizing Voltage |  | 3.2 KV/mm | 3.0 KV/mm | 3.0 KV/mm |
|  | Material | SiO | SiO | — |
| Layer 10 | Thickness | 1 $\mu$m | 1 $\mu$m | — |
| Temperature of the plate 1 during the application of layer 10 |  | 200° C. | 170° C. | — |
| Coupling Factor Keff |  | 16.5% | 16.5% | 16.0% |
| Insertion Loss |  | 21.9 dB | 21.8 dB | 23.3 dB |

Table II

|  | Device A | Device B |
|---|---|---|
| Sampled Pieces | 40 | 40 |
| High Quality | 31 | 20 |
| Poor Quality 1 | 9 | 11 |
| Poor Quality 2 | 0 | 9 |

As apparent from Table II, when the devices A which were manufactured by the method of the present invention were inspected, 31 of the acoustic surface wave interaction devices out of 40 proved to have a high quality, whereas when the devices B which were manufactured by the conventional method were inspected, only 20 of the acoustic surface wave interaction devices out of 40 proved to have a high quality. Therefore, it is apparent that the method of the present invention provides high quality devices more reliably. A higher percentage of devices made by the conventional method was found to have defects of "Poor quality 1" type than was the case with the devices prepared by the method of the present invention. (Typical deflects of this class include electrodes not properly formed by the etching process or the like due to the adherence of the oil employed during the polarization.)

In the case where the device B is heated up to 200° C. during the application of the layer 10, it is found that the polarization of the piezoelectric plate 1 is unfavorably reduced with consequent deterioration of the frequency characteristic.

It is to be noted that the upper conductive layer 11 which has been described as being provided together with the layer 12 for the application of polarization voltage can be eliminated. In this case, polarization voltage can be applied between the terminal portions 5 to 8 and the lower layer 12. Furthermore in another variation, the layer 12 can be provided only those parts of the flat surface 1b underlying the interdigitated electrodes 3 and 4.

It is also to be noted that in general the coupling factor Keff is obtained by drawing the characteristic of the interdigitated transducer on a Smith's equivalent chart through the so-called method of active conductance, in which the conductance factor of the central frequency is measured to provide the coupling factor Keff. However, in the present invention, the coupling factor Keff is obtained by the method of active admittance, in which a circular chart having frequency represented in the abscissa and conductance and susceptance represented in the ordinate is employed obtained the conductance factor at the central frequency. In this way, a precise value of coupling factor Keff is obtained.

Although the present invention has been fully described by way of example with reference to the accompanying drawings, it is to be noted that various changes and modifications are apparent to those skilled in the art. Therefore, unless such changes and modifications depart from the true scope of the present invention as limited only by the appended claims, they should be construed as included therein.

What is claimed is:

1. A method for manufacturing an acoustic surface wave interaction device comprising the steps of:
    (a) preparing a piezoelectric plate having first and second flat major surfaces;
    (b) forming a plurality of interdigitated electrodes having a predetermined pattern on said first flat surface of said piezoelectric plate, each of said interdigitated electrodes having a plurality of fingers which are interleaved and a terminal member connected to said fingers;
    (c) applying a thin layer of dielectric material to said first flat surface such that said thin layer of dielectric material entirely covers said fingers of said interdigitated electrodes but leaves at least one portion of each of said terminal members uncovered;
    (d) applying a first layer of conductive material on said second flat surface of said piezoelectric plate; and
    (e) applying a predetermined DC voltage across the thickness of said piezoelectric plate, between said first flat surface of said piezoelectric plate and said first layer of conductive material, for polarizing said piezoelectric plate in the direction of its thickness.

2. A method as claimed in claim 1, further comprising the step of applying a second layer of conductive material on said first flat surface of said piezoelectric plate over said thin layer of dielectric material, said second layer of conductive material being held in contact with said uncovered portion of said terminal members, said further step being effected subsequent to step (d) but before step (e), said step of applying said DC voltage across said plate comprising the step of applying said DC voltage between said first and second conductive layers.

3. A method as claimed in claim 1, wherein said predetermined DC voltage is higher than the saturation voltage for polarizing said piezoelectric plate.

4. A method of claimed in claim 1, wherein said piezoelectric plate is made of a ceramic material.

5. A method for manufacturing an acoustic surface wave interaction device comprising the steps of:
 (a) preparing a piezoelectric plate having first and second flat major surfaces;
 (b) applying a first layer of conductive material to said first flat surface of said piezoelectric plate;
 (c) forming an array of interdigitated electrodes having a predetermined pattern on said second flat surface of said piezoelectric plate, each of said interdigitated electrodes having a plurality of fingers which are interleaved and a terminal member connected to said fingers;
 (d) applying a thin layer of dielectric material to said second flat surface of said piezoelectric plate, such that said thin layer of dielectric material entirely covers said fingers of said interdigitated electrodes but leaves at least one portion of each said terminal member uncovered; and
 (e) applying a predetermined DC voltage across the thickness of said piezoelectric plate, between said respective uncovered portions of said terminal members and said first layer of conductive material, for polarizing said piezoelectric plate in the direction of its thickness.

6. A method for manufacturing an acoustic surface wave interaction device comprising the steps of:
 (a) preparing piezoelectric plate having first and second flat major surfaces;
 (b) forming an array of interdigitated electrodes having a predetermined pattern on one flat surface of the piezoelectric plate, said interdigitated electrodes each having a plurality of fingers which are interleaving and a terminal member connected to said fingers;
 (c) applying a first layer of conductive material to said second flat surface of said piezoelectric plate;
 (d) applying a thin layer of dielectric material to said first flat surface of said piezoelectric plate, such that said thin layer of dielectric material entirely covers said fingers of said interdigitated electrodes but leaves at least one portion of each said terminal member uncovered; and
 (e) applying a predetermined DC voltage across the thickness of said piezoelectric plate, between said respective uncovered portions of said terminal members and said first layer of conductive material, for polarizing said piezoelectric plate in the direction of its thickness.

* * * * *